(12) United States Patent
Koenig et al.

(10) Patent No.: US 6,972,136 B2
(45) Date of Patent: Dec. 6, 2005

(54) ULTRA LOW RESIDUAL REFLECTION, LOW STRESS LENS COATING AND VACUUM DEPOSITION METHOD FOR MAKING THE SAME

(75) Inventors: Glen A. Koenig, Stratford, CT (US); Nicholas G. Niejelow, Stratford, CT (US)

(73) Assignee: Optima, Inc., Stratford, CT (US)

( * ) Notice: Subject to any disclaimer, the term of this patent is extended or adjusted under 35 U.S.C. 154(b) by 172 days.

(21) Appl. No.: 10/444,582

(22) Filed: May 23, 2003

(65) Prior Publication Data

US 2004/0234780 A1    Nov. 25, 2004

(51) Int. Cl.$^7$ .................... B05D 5/06; C23C 14/54; G02B 1/11
(52) U.S. Cl. ................. 427/164; 427/10; 427/166; 427/255.7; 359/580; 359/581; 359/589
(58) Field of Search ............. 427/10, 566, 567, 427/585, 164, 166, 255.7, 419.4; 359/580, 359/581, 582, 588, 589

(56) References Cited

U.S. PATENT DOCUMENTS

| | | | |
|---|---|---|---|
| 3,185,020 A | 5/1965 | Thelen | |
| 3,695,910 A | 10/1972 | Louderback et al. | |
| 3,781,090 A | 12/1973 | Sumita | |
| 3,829,197 A | 8/1974 | Thelen | |
| 3,854,796 A | 12/1974 | Thelen | |
| 3,892,490 A * | 7/1975 | Uetsuki et al. | 356/388 |
| 4,387,960 A * | 6/1983 | Tani | 359/588 |
| 4,609,267 A | 9/1986 | Deguchi et al. | |
| 4,850,660 A * | 7/1989 | Jones et al. | 359/359 |
| 4,921,760 A * | 5/1990 | Tani et al. | 428/446 |
| 5,015,523 A | 5/1991 | Kawashima et al. | |
| 5,026,469 A | 6/1991 | Kunkel et al. | |
| 5,124,019 A | 6/1992 | Kunkel et al. | |
| 5,170,291 A | 12/1992 | Szczyrbowski et al. | |
| 5,216,542 A | 6/1993 | Szczyrbowski et al. | |
| 5,414,506 A | 5/1995 | Saisho et al. | |
| 5,425,983 A * | 6/1995 | Propst et al. | 428/216 |
| 5,494,743 A * | 2/1996 | Woodard et al. | 428/336 |
| 5,852,513 A * | 12/1998 | McDole et al. | 359/580 |

(Continued)

FOREIGN PATENT DOCUMENTS

JP    63-121801 A  *  5/1988

(Continued)

*Primary Examiner*—Timothy Meeks
*Assistant Examiner*—Wesley D. Markham
(74) *Attorney, Agent, or Firm*—DeLio & Peterson, LLC

(57) ABSTRACT

A method is provided for coating optical lenses and other optical articles with anti-reflection (AR) coatings. The lenses have low reflectivity, provide a substantially white light reflection and have a low stress AR coating and are ideally suited for optical lenses made using a molding procedure which provides a low stress lens substrate. In one aspect the method uses special coating compositions with one being a high index of refraction composition and the other being a low index of refraction composition. In another aspect a method is also disclosed using an optical monitor in conjunction with a conventional vapor deposition apparatus whereby an optical reference lens is used and a particular light frequency of reflected light is measured and this measurement is then used to determine when the desired optical coating is achieved. In a still further aspect the method also preferably calculates the optical thickness of each layer using a specific ratio of blue to green to red colors in the reflected light. The stress of the AR coating is also controlled by adjusting the optical thickness for each layer, if necessary, to minimize the difference in the tensile stresses and compressive stresses between low index/high index layers.

3 Claims, 2 Drawing Sheets

U.S. PATENT DOCUMENTS

| | | | |
|---|---|---|---|
| 5,944,964 A * | 8/1999 | Solberg et al. | 204/192.26 |
| 5,952,084 A * | 9/1999 | Anderson et al. | 428/212 |
| 6,248,448 B1 * | 6/2001 | Lippey et al. | 428/432 |
| 6,250,758 B1 * | 6/2001 | Yoshihara et al. | 351/163 |
| 6,274,014 B1 | 8/2001 | Matsumoto et al. | |
| 6,287,430 B1 | 9/2001 | Matsumoto et al. | |
| 6,297,128 B1 * | 10/2001 | Kim et al. | 438/437 |
| 6,481,369 B1 * | 11/2002 | Takahashi et al. | 118/723 EB |
| 6,503,636 B1 * | 1/2003 | Le Masson et al. | 428/472 |
| 2003/0133124 A1 * | 7/2003 | Takahashi et al. | 356/492 |

FOREIGN PATENT DOCUMENTS

| | | | |
|---|---|---|---|
| JP | 11-131240 A * | 5/1999 | |

* cited by examiner

FIG. 2
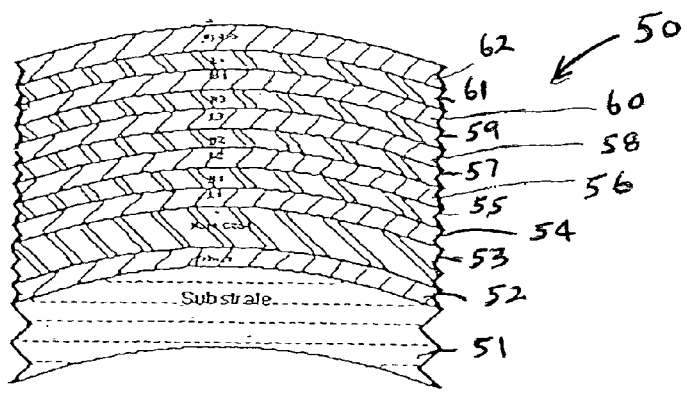
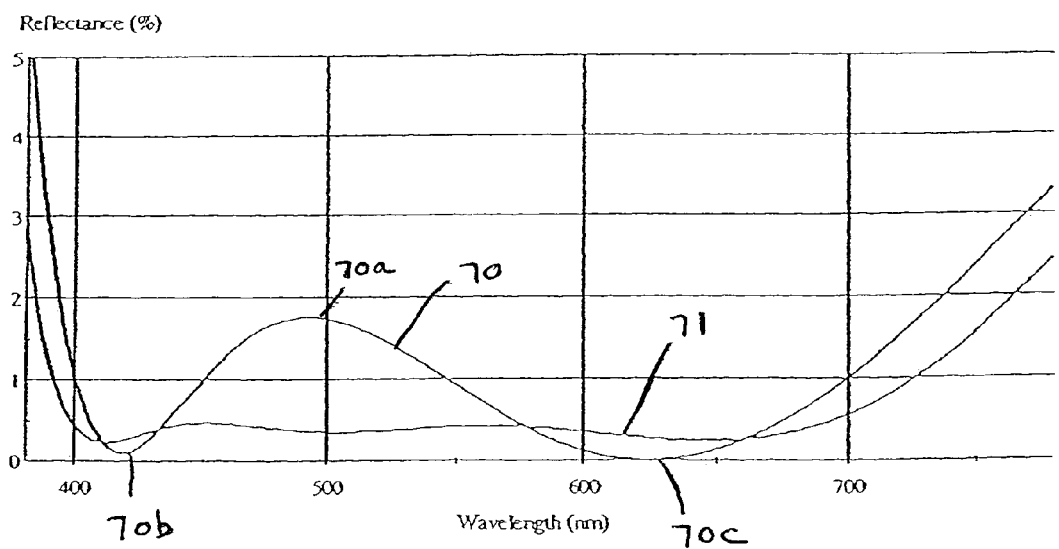
FIG. 3

ULTRA LOW RESIDUAL REFLECTION, LOW STRESS LENS COATING AND VACUUM DEPOSITION METHOD FOR MAKING THE SAME

BACKGROUND OF THE INVENTION

1. Field of the Invention

This invention relates to low stress, low residual reflection multi-layer anti-reflection coatings for optical lenses and, in particular, to a composition for forming a high refractive index anti-reflection coating and a composition for forming a low refractive index anti-reflection coating, methods for making optical lenses preferably using the composition including using a conventional vacuum deposition chamber employing an optical monitor to control the optical properties of the anti-reflection coating.

2. Description of Related Art

It is well known in the optical arts that a reflection of light off glass and other surfaces is undesirable or creates visual sight discomfort. The reflected light makes a user feel dizzy or causes an image to be blurred, among other such undesirable effects. For optical lenses this is of particular concern and compositions and methods have been developed for reducing the reflection of light off the optical lens surface.

A considerable number of anti-reflection (AR) coatings have been suggested in the prior art for a primary design purpose of ensuring that the residual reflection will be held to a relatively small value over the entire range of the visual spectrum. Single or double layer coatings have provided significant improvement but the residual reflections are still more than desired and to improve the AR properties, the prior art has resorted to AR coatings having three or more layers.

The optical thickness of each deposited AR layer is typically controlled to optimize or maximize the AR effect and as well known the optical thickness of a layer is the product of the real (geometrical) thickness and the refractive index of the respective layer. The optical thickness is generally described in fractions of a wavelength of a designated reference light ray for which the coating is to be used. Frequently, the design wavelength will be about 510 nanometers (nm) to 550 nm. The optical thickness of respective AR layers may be defined by the following general formula where N is the refractive index, d is the geometrical thickness of the layer and $\lambda$ is the reference wavelength:

$$N_a d_a = x\lambda$$

wherein x is a number, typically a fraction, indicating the fraction of the wavelength and a is an integer representing the layer coated with the lowest number being closer to the eyeglass lens. Typically x will be 0.25 which represents a quarter wavelength optical thickness.

As well known in the art today, the optical thickness of the individual layers can be adjusted to obtain the same results on substrates of different refractive indices.

In the formation of each AR layer, the deposited layer exhibits a maximum value of interference for every one fourth of the wavelength of light for measurement of the thickness, i.e., $\lambda/4$. Thus, the thickness of an optical AR layer is conventionally controlled during the formation thereof by utilizing this phenomenon with the optical thickness being multiples of 0.25.

While the following description will be directed to polycarbonate lens for convenience, it will be understood to those skilled in the art that the invention applies to other lens materials such as polyurethane, acrylic glass, CR-39, etc. Stress in a polycarbonate lens causes birefringence and optical distortion. While not visible under normal circumstances it is evident when polycarbonate is placed between two polarized filaments and this is one of the reasons that polycarbonate lenses are optically inferior to lenses such as glass, CR 39 and other such materials. The new polycarbonate lens developed by Optima, trade name Resolution®, is free of this stress and birefringence and thus the current processing to provide AR coatings and its inherent stress now becomes more of a concern to makers of such lenses.

In addition, the current state of AR coatings have a residual green reflection which varies between 0.75% and 1.5% residual reflection. This green color is cosmetically unpleasant and acts as a green filter which decreases the amount of green light the human eye perceives. A lower residual reflection with no filtering effect is much more desirable both in the performance of the coating and in its cosmetic appearance. It is preferred that only white light be reflected.

The current design and production of AR coatings are well understood in the industry today and typically the residual color is left in the design to make manufacturing much simpler and cheaper. Current technology uses a Quartz Crystal Monitor to control the physical thickness of the individual layer required to produce an AR coating. The current coating standards call for a 4-layer HLHL coating, where H represents a high index dielectric material chosen for its specific refractive index, and L represents a low index dielectric material also chosen for its refractive index. Each layer typically consists of an optical quarter wave of the high or low index material chosen. Low index materials include $SiO_2$ and $MgF_2$. High index materials include oxide sub groups of the following materials: Zr, Hf, Ta, Ti, Sb, Y, Ce, and Yb. While not inclusive, these materials are the most widely used today.

Many AR coatings being produced today also include an adhesion layer, a buffer layer, an abrasion resistance layer, and a hydrophobic outer layer. These layers are used to enhance the performance of the coating from a consumer standpoint but have very little effect on the optical qualities of the AR coating.

Another concern in the making of AR coatings is that the high index and low index material induce both compressive as well as tensile stress in the AR coating film. The current art of anti-reflection (AR) coatings, however, does not take into account the amount of stress inherent in the coating itself. This is because the current lens produced on the market today such as the polycarbonate lens has so much stress already that the additional amount of stress caused by the AR coating is not considered important. This is one of the reasons that current production techniques try to limit the number of layers used. In general, a low index material such as silica produces a tensile stress which is about 5 times the compressive stress produced by a high index material. If the coating becomes too thick with additional layers, the differences in stress caused by the low index material and high index material can cause the AR film to separate and come off the lens and also cause adverse optical effects.

Another reason current technology limits the number of layers is that the quartz crystal monitor is only capable of measuring the physical thickness of the applied materials. An AR coating however is designed around optical qualities, which are very dependent on the refractive indexes of the materials being used. These indexes will shift as coating conditions such as available O2, coating rate and deposition temperature change. The green reflectance left in the coating does an excellent job of hiding these imperfections during normal production and the high peak reflectance in the very broad green visible spectrum can shift during production and be unnoticeable to all except a well trained professional.

In order to form an AR coating with no residual color, i.e. white, and a low overall residual reflection, the manufacturer must typically add several additional AR layers. The added thickness created by these layers causes an increase in stress and possible AR coating delamination and these competing problems must be addressed by the lens manufacturer.

Bearing in mind the problems and deficiencies of the prior art, it is therefore an object of the present invention to provide a composition for making a high index of refraction AR coating on an optical lens or other optical article.

It is another object of the present invention to provide a composition for making a low index of refraction AR coating on an optical lens or other optical article.

It is yet another object of the present invention to provide a method for making optical lenses or other optical articles having an AR coating using the above compositions.

It is still yet another object of the present invention to provide a method for making optical lenses having an AR coating using an optical monitor to provide a desired AR optical coating on the optical lens or other optical articles.

A further object of the present invention is to provide a method for coating optical lenses and other optical articles with an AR coating which has low residual reflection, the reflective light is essentially white light and the AR coating has low stress.

A further object of the present invention is to provide optical lenses and other optical articles made using the methods of the invention.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a composition for making a high index of refraction AR coating on an optical lens comprising a mixture of cerium and titanium oxides wherein the cerium oxide is less than about 25% by weight of the composition.

In a further aspect of the invention, a composition is provided for making a low index of refraction AR coating on an optical lens comprising a mixture of silicon and aluminum oxides wherein the aluminum oxide is less than about 10% by weight of the composition.

In still another aspect of the invention a method is provided for making optical lenses having an anti-reflection (AR) coating comprising the steps of:

supplying one or more optical lens and an optical reference lens;

positioning the lens and the optical reference lens in a vacuum deposition chamber in the same coating plane, the vacuum deposition chamber having an optical monitor communicating with the optical reference lens;

providing in the chamber at least one source of a high index of refraction AR coating composition and at least one low index of refraction AR coating composition;

applying a layer of the high index of refraction composition on the lens until the desired optical thickness coating is obtained as determined by the optical monitor;

applying a layer of the low index of refraction composition on the lens until the desired optical thickness coating is obtained as determined by the optical monitor; and repeating the AR application steps until the desired AR coating is applied;

wherein the optical monitor comprises means for directing an on/off beam of light into the chamber at the optical reference lens, measuring the reflected light from the reference lens at a particular frequency and using this measurement to determine when the desired optical coating thickness is achieved.

In another aspect of the invention a method is provided for making optical lenses having an anti-reflection (AR) coating comprising the steps of:

supplying an optical lens;

positioning the lens in a vacuum chamber of a vacuum deposition apparatus;

providing in the vacuum chamber a source of at least one high index of refraction AR composition and at least one low index of refraction AR composition wherein one of the high index materials comprises a mixture of cerium and titanium oxides and one of the low index materials comprises $SiO_2$;

applying a layer of the high index material on the lens until the desired optical thickness coating is applied;

applying a layer of the low index material on the lens until the desired optical thickness coating is applied; and repeating the application steps until the desired anti-reflection coating is applied.

In another aspect of the invention a method is provided for making optical lenses having an anti-reflection (AR) coating comprising the steps of:

supplying an optical lens;

positioning the lens in a vacuum chamber of a vacuum deposition apparatus;

providing in the vacuum chamber a source of at least one high index of refraction AR composition and at least one low index of refraction AR composition;

applying a layer of the high index material on the lens until the desired optical thickness coating is applied;

applying a layer of the low index material on the lens until the desired optical thickness coating is applied; and repeating the application steps until the desired anti-reflection coating is applied;

with the proviso that the reflected light off the anti-reflection coating be controlled so that the ratio of blue light to green light to red light provides a substantially white reflected light.

In a further aspect of the invention, the optical thickness of the AR coating layers are adjusted, if necessary, to minimize the difference in tensile stress and compressive stress in the adjacent layers.

In another aspect of the invention an optical lens or other optical article is provided which is made by the above methods.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 2 is an illustration of a lens containing an anti-reflection coating made using the composition and method of the invention.

FIG. 3 is a graph showing the reflectance (percent) as a function of wavelength for a conventional anti-reflection coating vs. an anti-reflective coating made using the invention.

DESCRIPTION OF THE PREFERRED EMBODIMENT(S)

Figure 1:
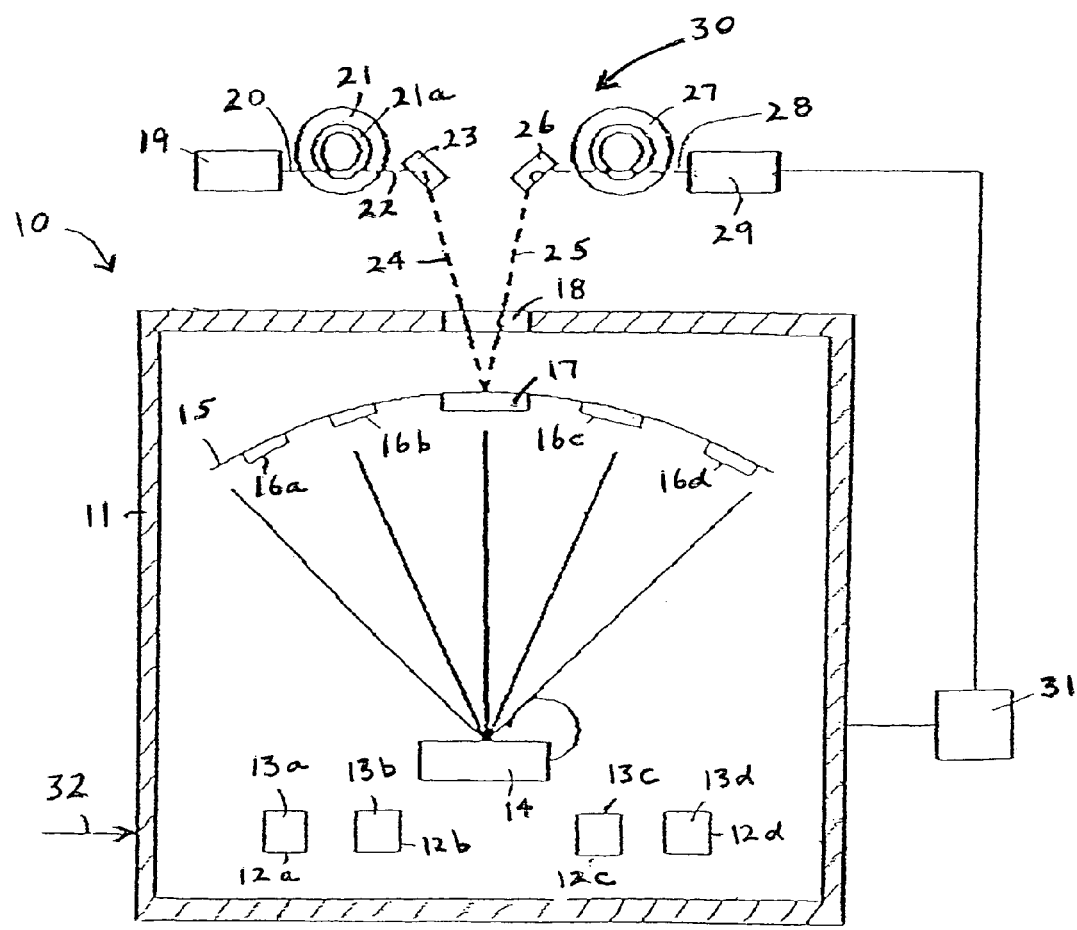
FIG. 1 is a schematic illustration of a conventional vacuum chamber used to deposit coatings on substrates and the optical monitor of the invention used in conjunction with the vacuum chamber.

In describing the preferred embodiment of the present invention, reference will be made herein to FIGS. 1–3 of the drawings in which like numerals refer to like features of the invention. Features of the invention are not necessarily shown to scale in the drawings.

Applicants have invented AR coating compositions in both the low and high index ranges, which allow control of the AR coating with regard to residual reflection and the coating stress produced. This allows the number of AR layers used to be increased significantly if necessary to achieve the desired lens. Applicants also use an optical monitor to control the optical thickness and rate of the materials being coated. The optical monitor uses a special test glass, which receives the coating material at the same time as the lens. By measuring the coating optically in-situ, one can automatically correct for any minor changes in refractive index and stop the coating of the layer at the precise optical thickness required. This is extremely important as any error induced in one layer can cause each subsequent layer to be mismatched. In this respect, the optical monitor besides being optically correct can also make minor corrections in subsequent layers if required.

The end result of Applicants' invention is a cosmetically pleasing coating, with low residual unwanted color, low reflectance and low stress.

Although the present invention has been described with reference to a specific embodiment, those of skill in the art will recognize that changes may be made thereto without departing from the scope and spirit of the invention as set forth in the appended claims. While the AR coating was developed specifically for polycarbonate lenses, the techniques described can be used for any lens materials, organic or inorganic, including glass, CR-39, and lenses with indexes ranging from 1.40 to >1.90.

Referring now to FIG. 1, a conventional vacuum chamber is shown generally as 10 for depositing an anti-reflection coating on lenses and includes an optical monitor shown generally as numeral 30.

Any conventional vacuum coating apparatus can be used and exemplary are those shown in U.S. Pat. Nos. 3,695,910; 5,026,469; and 5,124,019, which patents are hereby incorporated by reference.

The vacuum chamber comprises a chamber 11 having a transparent section 18 at the top of the chamber. In the vacuum chamber are positioned containers 12a, 12b, 12c and 12d, which are used to hold coating materials 13a, 13b, 13c and 13d, respectively. It will be appreciated by those skilled in the art that the number of containers and coating materials will vary depending on the anti-reflection coatings desired to be applied to the lens substrate.

An E-gun 14 is shown which is used to provide electrons which are directed at the various containers to volatilize the material in the container. Depending on the material to be volatilized, the container is moved into position so that the E-gun electrons are directed at the container and material. The material is vaporized and is spread throughout the chamber as shown by the arrows. A substrate holder 15 is shown which is curved (typically a dome) and the volatilized material is applied evenly on all the substrate surfaces. A distribution shield is typically used to apply the volatilized materials evenly. Four substrates are shown as 16a–16d. Typically 75–140 substrates are positioned on a dome. A reference substrate 17 is positioned in the center of the substrate holder 15 and, it too will likewise be coated by the volatilized material at the same rate and with the same composition as the other substrates 16 on the substrate holder 15. Input 32 is used typically for gases such as $O_2$ which is used to form oxides for some AR layers.

In operation, the desired container and coating material will be moved in position in the vacuum chamber and the E-gun activated to direct electrons at the container to volatize the coating material. The coating material will be vaporized and the vapors coat each of the substrates 16 held by the substrate holder 15. The reference substrate 17 will likewise be coated. Such a coating process and vacuum chamber are conventional and well known in the art as shown in the above patents. Vacuum deposition is preferred but other methods such as sputtering may be used.

During the coating operation, it is preferred to use an optical monitor and a high intensity beam of light 20 is projected from light source 19. The beam of light 20 passes through a light chopper 21 which turns the beam on and off providing an on/off beam 22. The sequence of the on/off light is synchronized with the light detector 29 at the end of the monitor. This is important since during the off period of the light beam, the light detector 29 will still receive a large amount of ambient light. Since it is programmed that the light it is receiving during the off period is noise, it subtracts it from the amount of light it receives when the light beam is on. This ensures that only the light which it is supposed to be measured, is in fact measured.

The chopped light 22 also passes through a focusing lens 21a and is then directed towards a high reflectance mirror 23. The reflectance mirror 23 turns the beam as reflected beam 24 towards the transparent opening 18 in the chamber at the reference substrate 17 which is disposed inside the chamber. As noted above, the reference substrate 17 is located in the same curvilinear plane as the substrates 16 which are to be coated. This ensures that during the actual AR coating process the reference substrate 17 receives the same coating of AR material as each of the substrates being coated.

When the reflected beam 24 reaches the reference substrate 17, the majority of the light passes through the reference substrate. Approximately 5% of the light from the back surface and 5% of the light from the front surface are reflected. It is preferred that the beam of light enters the chamber at a small incident angle so that the light beam reflected from the front and back surface of the monitor glass return at a slightly different angle. This is important because only the light being reflected from the front surface of the reference substrate is to be measured. This reflected light from the front surface is shown as second reflected beam 25. The beam reflected from the back surface is not shown.

The 5% of the original light which is being reflected back from the front surface as beam 25 now passes out of the chamber through transparent section 18 and hits a second reflection mirror 26 and is turned towards the light detector 29. Before reaching the detector 29 light beam 25 passes through a light filter 27 which is a frequency specific filter designed to allow only one frequency of light to pass through the filter. This specific frequency light is shown as beam 28 which beam is then passed into light detector 29.

The method of the invention provides an optical coating which is accurate at a specific desired light frequency. Because of this, in order to design and form optical coatings, the AR coating thickness desired must be designed through a specific light frequency. The light filter 27 is chosen to pass only the light frequency chosen by the designer when designing the AR coating. Typically, the frequency is 480 to 530 nm.

The specific frequency light continuing into the detector 29 is then measured for the amount of light received and the detector amplifies the light to a more accurate, readable intensity. Through the use of high-resolution A/D converters and microprocessors, the detector is capable of detecting light changes as small as 0.01%. The light detector 29 sends the light intensity data to the vaporization control system 31 which uses the information to determine the optical thickness for each layer of material being applied and when to stop the vaporization process for the material to be applied when the desired optical thickness is coated on the lens. It should be noted that it is because the optical monitor 30 is reading the change in optical performance during the coating process at the same time as the actual change in optical performance on the lens surface which makes the monitor so accurate. The monitor 30 also allows the system to make minor corrections for shifts in refractive index during the coating process. It should be appreciated that the monitor 30 relies strictly on optical performance of the coating and not material physical thickness which is coated on the substrate surface.

The AR coating stress can also be controlled as discussed above to change the design AR coating optical thickness to minimize the difference between the tensile and compressive forces in the layers. Changes in optical thicknesses will generally be in steps of 0.5λ since this has no significant effect on the optical properties.

FIG. 2 is a representation of the AR coating of the invention on a lens substrate. All coatings begin at the substrate and are coated sequentially outward, both in design and in the actual manufacture. The substrate shown is a stress-free polycarbonate optical lens. This lens was made using a patented process as shown in U.S. Pat. No. 6,042,754, assigned to the assignee of the subject invention. Although the process being described is for this particular lens, it can also be used on any lens material having refractive indexes of 1.40 through 1.9, or higher, with modifications to the AR layer thicknesses to compensate for the different lens materials. All thickness measurements are in Quarter Wave Optical Thickness (QWOT) (0.25λ). The frequency of the light used to design the formula and used during the actual production process is between 470 nm and 580 nm. The AR coating layers were calculated as discussed herein by controlling the ratio of the amount of blue light to green light to red light in the light reflected off the coated optical lens. Blue was controlled to 37.16%, green to 28.57% and red to 34.27%. It will be appreciated that the calculated optical thicknesses can be varied somewhat to accommodate manufacturing requirements.

Details of the lens 50 shown in FIG. 2 are as follows:

Substrate 51—Polycarbonate lens with a refractive index of approximately 1.59.

Primer 52—A primer is applied to the lens so that the final hard coat will adhere more readily. Approximate thickness is 0.5 to 1.0 microns. Refractive index of 1.50.

Hard Coat 53—A polysiloxane based thermal cure material with a thickness of between 3.5 to 5.0 microns. Refractive index of 1.49.

L1 54—A low index material such as $SiO_2$. The thickness is approximately 1.70–1.9 QWOT. The refractive index is approximately 1.45–1.5.

H1 55—A high index material of the invention designed to have lower stress and increased refractive index. The thickness is approximately 0.10–0.25 QWOT. The refractive index is approximately 2.04–2.30.

L2 56—Same material as L1. Thickness is approximately 0.10–0.25 QWOT.

H2 57—Same material as H1. Thickness is approximately 1.00–1.25 QWOT.

L3 58—Same material as L1. Thickness is approximately 0.01–0.1 QWOT.

H3 59—Same material as H1. Thickness is approximately 1.25–1.50 QWOT.

M1 60—A middle index material used to help increase adhesion and improve scratch resistance. The thickness is approximately 0.01–0.1 QWOT.

L4 61—Same material as L1. Thickness is approximately 1.75–2.00 QWOT.

Hydro 62—A polysiloxane material applied to the outer surface to form a smooth slick surface. It improves the cleanability of the lens. The approximate thickness is 0.01–0.25 QWOT. The refractive index is approximately 1.40–1.50.

The lens was found to have low stress, low reflection and low residual color, i.e., the reflected light was essentially white. The final lens has a curve similar to curve 71 in FIG. 3.

FIG. 3 shows graphically the difference between the AR coating of the invention and a typical AR coated lens currently available on the market. This graph only shows the optical superiority, and not the decreased stress capability of the coating. Curve 70 represents the residual reflection found on AR coatings being produced for the market today and shows peak 70a which is in the green spectrum and produces the residual green reflectance of conventional lenses. It should also be noted that minima points 70b and 70c represent blue light and red light reflectance, respectively.

As discussed previously, this is commercially acceptable since it hides the fluctuations in coating thickness during the production process. The peak reflection 70a (highest point on curve) can be adjusted to the right or left by moving the entire curve right or left. The result is to change the green residual color to a more bluer appearance or a yellower appearance. In addition, an AR coating company can rotate the curve so that the minimum on the right side of the curve comes up to around 0.75% reflection. The result is that the total amount of residual reflection rises quite significantly. The other result is that the residual color has a definite greenish yellowish appearance.

Curve 71 represents the AR coating of the invention as shown in the lens of FIG. 2. Notice that the total residual reflection is much lower than the conventional curve 70. Also notice that the curve extends further into both the infrared and ultraviolet regions of the visible light spectrum (wider). This is a significant factor since all AR coatings on lenses will have a tendency to change color as the angle of the incident light (angle of light hitting the surface) becomes less and less direct. This apparent change in color is caused by the curve shifting to the left as the angle of incidence increases. The narrower the total curve, the quicker it changes color. It is very noticeable because suddenly green becomes yellow, orange or red. Curve 71 has a much broader width and also has no color. As the angle of incidence increases, the curve will begin to shift left, but the color will remain unchanged until the angle is extremely steep such as up to 45°.

Applicants' invention is directed in one aspect to modifying the conventional curve shown as numeral 70 to a white light curve such as shown as numeral 71. The white light curve 71 has a combination of colors that produces a white light reflection and does not have a predominant green reflection as shown in the conventional curve 70.

Applicants have discovered that adjusting the ratios of blue light, green light and red light to each other in the reflected light from the anti-reflection coating will produce a curve shown as numeral 71 which produces a substantially white light. It is known to use computer software to calculate thin film thicknesses for optical lenses by specifying certain optical parameters which the computer software will use to calculate and provide thin film thicknesses for the AR coating. Merely specifying, for example, that the blue, green and red levels are the same will not produce a white light but will provide a curve such as curve 70 which has a green peak and a residual green reflection.

It is an important feature of Applicants' invention that the ratio of blue peak, green peak and red peak in the reflected light be controlled to provide a white light reflection. The three colors are controlled within a particular ratio to produce a white light reflection. In general, in color peak percent, the blue peak will range from about 34 to 40%, preferably 36–38%, e.g., 37%, the green about 24 to 32%, preferably 26–30%, e.g., 29%, and the red about 30 to 38%, preferably 32–36%, e.g., 34%. When these ratios are supplied to the computer software along with other optical properties such as the refractive indices of the materials being used and a table of the refractive indices over a range of optical thicknesses, the software will calculate the AR layers needed to produce the specified blue, green and red peaks. A typical computer software program is called "Essential MacLeod", Optical Coating Design Program, Copyright Thin Film Center, Inc. 1995–2003, Version V 8.6, which program is distributed by the Thin Film Center, Inc. Other similar known software programs can be used to calculate thin film thicknesses which meet the above ratios. It should also be appreciated that the optical thicknesses needed to meet the above ratios can be calculated manually as is known in the art. A typical calculation method is shown in U.S. Pat. No. 4,609,267, which patent is hereby incorporated by reference, but other known methods for calculating optical thicknesses can be used.

In another aspect of the invention it is important that the AR coating have low stress since high stress causes optical distortion and the AR coating may delaminate. It has been found that the high index material and the low index material have different stresses when formed as thin films and it is a feature of the invention to minimize the difference in the stresses in the layers to produce an AR coating having low stress.

For example, it has been found that silicon dioxide which is a typical low index material provides a tensile stress when coated. On the other hand, high index materials typically provide a compressive stress when coated. It has been found, however, that the compressive stress is usually less than the tensile stress of the low index material. Accordingly, this provides a difference in tensile and compressive stresses between layers and could lead to delamination and optical distortion.

It is thus an important feature of Applicants' invention to adjust, if necessary, each adjacent layer of the optical coating to balance the tensile stress and compressive stress. This is accomplished by first calculating the optical thicknesses for the various layers as described above specifying the desired reflective peaks (ratios) for blue, green and red light. Once the optical thickness and number of AR layers are determined by the computer calculations, the optical thickness of each layer may be modified in $0.5\lambda$ steps to balance (equilibrate) the stress between layers. For example, if a low index layer has an optical thickness of $0.25\lambda$ and provides a tensile stress of 5 and the adjacent high index layer having also a $0.25\lambda$ optical thickness produces a compressive stress of only 1, the optical thickness of the high index layer is preferably increased to increase the compressive force to balance or minimize the higher tensile stress of the preceding low index layer. In this example, the optical thickness of the high index layer could be adjusted to $0.75\lambda$ or even $1.25\mu$ to increase the compressive stress to be closer to the low index layer tensile stress. Increasing the optical thickness of one layer vs. the adjacent layer will have no significant effect on the white light reflection of the coated lens because the optical thickness will be typically increased in $0.5\lambda$ steps.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus having described the invention, what is claimed is:

What is claimed is:

1. A method for making optical lenses having an anti-reflection (AR) coating comprising the steps of:
   supplying an optical lens;
   positioning the lens in a vacuum chamber of a vacuum deposition apparatus;
   providing in the vacuum chamber a source of at least one high index of refraction AR composition and at least one low index of refraction AR composition;
   applying a layer of the high index material on the lens until the desired optical thickness coating is applied;
   applying a layer of the low index material on the lens until the desired optical thickness coating is applied; and
   repeating the application steps until the desired anti-reflection coating is applied;
   with the proviso that the reflected light off the anti-reflection coating be controlled so that the ratio of blue light to green light to red light provides a substantially white reflected light and the further step of adjusting the optical thicknesses of the AR coating layers to minimize the differences between the tensile stress and compressive stress of the layers.

2. The method of claim 1 wherein the ratio of blue light to green light to red light is about 34–40% to 24–32% to 30–38%.

3. The method of claim 2 wherein the ratio of blue light to green light to red light is about 36–38% to 26–30% to 32–36%.

* * * * *